(12) United States Patent
Uitterdijk et al.

(10) Patent No.: US 8,913,225 B2
(45) Date of Patent: *Dec. 16, 2014

(54) LITHOGRAPHIC APPARATUS AND DEVICE MANUFACTURING METHOD

(75) Inventors: Tammo Uitterdijk, De Bilt (NL); Erik Roelof Loopstra, Heeze (NL); Laurens Anthony Sanderse, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 722 days.

This patent is subject to a terminal disclaimer.

(21) Appl. No.: 13/189,288

(22) Filed: Jul. 22, 2011

(65) Prior Publication Data

US 2011/0279796 A1   Nov. 17, 2011

Related U.S. Application Data

(63) Continuation of application No. 12/213,543, filed on Jun. 20, 2008, now Pat. No. 8,013,978, which is a continuation of application No. 11/022,939, filed on Dec. 28, 2004, now Pat. No. 7,405,805.

(51) Int. Cl.
  *G03B 27/42*   (2006.01)
  *G03B 27/52*   (2006.01)
  *G03F 7/20*    (2006.01)

(52) U.S. Cl.
  CPC ........ *G03F 7/70341* (2013.01); *G03F 7/70958* (2013.01)
  USPC ............................................. 355/53; 355/30

(58) Field of Classification Search
  CPC .................................................. G03F 7/70341
  USPC ................................................. 355/30, 53, 67
  See application file for complete search history.

(56) References Cited

U.S. PATENT DOCUMENTS

| | | | |
|---|---|---|---|
| 3,573,975 | A | 4/1971 | Dhaka et al. |
| 3,648,587 | A | 3/1972 | Stevens |
| 4,346,164 | A | 8/1982 | Tabarelli et al. |
| 4,390,273 | A | 6/1983 | Loebach et al. |
| 4,396,705 | A | 8/1983 | Akeyama et al. |

(Continued)

FOREIGN PATENT DOCUMENTS

| | | |
|---|---|---|
| DE | 206 607 | 2/1984 |
| DE | 221 563 | 4/1985 |

(Continued)

OTHER PUBLICATIONS

M. Switkes et al., "Immersion Lithography at 157 nm", MIT Lincoln Lab, Orlando 2001-1, Dec. 17, 2001.

(Continued)

*Primary Examiner* — Hung Henry Nguyen
(74) *Attorney, Agent, or Firm* — Pillsbury Winthrop Shaw Pittman LLP (57) ABSTRACT

In an immersion lithographic apparatus, a final element is disclosed having, on a surface nearest the substrate, a layer bonded to the surface and having an edge barrier, of the same material as the layer, extending from the layer away from the substrate to shield the final element from a liquid. In an embodiment, the final element is attached to the apparatus via the layer and/or edge barrier, which may be made of a material with a coefficient of thermal expansion lower than the coefficient of thermal expansion of the final element.

20 Claims, 3 Drawing Sheets

(56) References Cited

U.S. PATENT DOCUMENTS

| | | | |
|---|---|---|---|
| 4,480,910 | A | 11/1984 | Takanashi et al. |
| 4,509,852 | A | 4/1985 | Tabarelli et al. |
| 5,040,020 | A | 8/1991 | Rauschenbach et al. |
| 5,121,256 | A | 6/1992 | Corle et al. |
| 5,610,683 | A | 3/1997 | Takahashi |
| 5,825,043 | A | 10/1998 | Suwa |
| 5,900,354 | A | 5/1999 | Batchelder |
| 6,191,429 | B1 | 2/2001 | Suwa |
| 6,236,634 | B1 | 5/2001 | Lee et al. |
| 6,597,514 | B2 | 7/2003 | Nishimura |
| 6,600,547 | B2 | 7/2003 | Watson et al. |
| 6,603,130 | B1 | 8/2003 | Bisschops et al. |
| 7,405,805 | B2 * | 7/2008 | Uitterdijk et al. ............... 355/53 |
| 8,013,978 | B2 * | 9/2011 | Uitterdijk et al. ............... 355/53 |
| 2002/0020821 | A1 | 2/2002 | Van Santen et al. |
| 2002/0163629 | A1 | 11/2002 | Switkes et al. |
| 2003/0123040 | A1 | 7/2003 | Almogy |
| 2004/0000627 | A1 | 1/2004 | Schuster |
| 2004/0075895 | A1 | 4/2004 | Lin |
| 2004/0114117 | A1 | 6/2004 | Bleeker |
| 2004/0120458 | A1 | 6/2004 | Dierichs et al. |
| 2004/0136494 | A1 | 7/2004 | Lof et al. |
| 2004/0160582 | A1 | 8/2004 | Lof et al. |
| 2004/0165159 | A1 | 8/2004 | Lof et al. |
| 2004/0207824 | A1 | 10/2004 | Lof et al. |
| 2004/0211920 | A1 | 10/2004 | Derksen et al. |
| 2004/0239954 | A1 | 12/2004 | Bischoff |
| 2004/0263809 | A1 | 12/2004 | Nakano |
| 2005/0007569 | A1 | 1/2005 | Streefkerk et al. |
| 2005/0018155 | A1 | 1/2005 | Cox et al. |
| 2005/0024609 | A1 | 2/2005 | De Smit et al. |
| 2005/0030497 | A1 | 2/2005 | Nakamura |
| 2005/0030506 | A1 | 2/2005 | Schuster |
| 2005/0046813 | A1 | 3/2005 | Streefkerk et al. |
| 2005/0046934 | A1 | 3/2005 | Ho et al. |
| 2005/0052632 | A1 | 3/2005 | Miyajima |
| 2005/0094116 | A1 | 5/2005 | Flagello et al. |
| 2005/0094119 | A1 | 5/2005 | Loopstra et al. |
| 2005/0094125 | A1 | 5/2005 | Arai |
| 2005/0110973 | A1 | 5/2005 | Streefkerk et al. |
| 2005/0122505 | A1 | 6/2005 | Miyajima |
| 2005/0132914 | A1 | 6/2005 | Mulkens et al. |
| 2005/0134817 | A1 | 6/2005 | Nakamura |
| 2005/0140948 | A1 | 6/2005 | Tokita |
| 2005/0146693 | A1 | 7/2005 | Ohsaki |
| 2005/0146694 | A1 | 7/2005 | Tokita |
| 2005/0151942 | A1 | 7/2005 | Kawashima |
| 2005/0200815 | A1 | 9/2005 | Akamatsu |
| 2005/0213065 | A1 | 9/2005 | Kitaoka |
| 2005/0213066 | A1 | 9/2005 | Sumiyoshi |
| 2005/0219489 | A1 | 10/2005 | Nei et al. |
| 2005/0225737 | A1 * | 10/2005 | Weissenrieder et al. ........ 355/53 |
| 2005/0233081 | A1 | 10/2005 | Tokita |
| 2005/0286030 | A1 * | 12/2005 | Shih et al. ....................... 355/30 |
| 2012/0212716 | A1 * | 8/2012 | Shirai et al. .................... 355/53 |

FOREIGN PATENT DOCUMENTS

| | | |
|---|---|---|
| DE | 224 448 | 7/1985 |
| DE | 242 880 | 2/1987 |
| DE | 102004059778 | 8/2005 |
| EP | 0023231 | 2/1981 |
| EP | 0418427 | 3/1991 |
| EP | 1039511 | 9/2000 |
| EP | 1510871 A2 | 3/2005 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| JP | 2005-093997 | 4/2005 |
| JP | 2005-202375 | 7/2005 |
| JP | 2006-165285 | 6/2006 |
| WO | WO 99/49504 | 9/1999 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2004/107048 | 12/2004 |
| WO | WO 2005/010611 | 2/2005 |
| WO | WO 2005/024517 | 3/2005 |
| WO | 2005/059645 | 6/2005 |
| WO | WO 2005/054953 | 6/2005 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths to Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future FAB International, vol. 15, Jul. 11, 2003.

H. Kawata et al., "Fabrication of 0.2μm Fine Patterns Using Optical Projection Lithography with an Oil Immersion Lens", Jpn. J. Appl. Phys. vol. 31 (1992), pp. 4174-4177.

G. Owen et al., "1/8μm Optical Lithography", J. Vac. Sci. Technol. B., vol. 10, No. 6, Nov./Dec. 1992, pp. 3032-3036.

(56) References Cited

OTHER PUBLICATIONS

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial $\lambda$/NA scaling equations for resolution, depth of focus, and immersion lithography, *J. Microlith., Microfab., Microsyst.* 1(1):7-12 (2002).

European Search Report for EP Application No. 05257739.2, dated Mar. 1, 2006.

English Translation of Japanese Official Action issued on Nov. 21, 2008 in Japanese Application No. 2005-375770.

\* cited by examiner

LITHOGRAPHIC APPARATUS AND DEVICE MANUFACTURING METHOD

This is a continuation of U.S. patent application Ser. No. 12/213,543, filed Jun. 20, 2008, now U.S. Pat. No. 8,013,978, which is a continuation of U.S. patent application Ser. No. 11/022,939, filed Dec. 28, 2004, now U.S. Pat. No. 7,405,805. The entire contents of each of the foregoing applications is hereby incorporated by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein. Water or an aqueous solution has been proposed for 248 and 193 nm projection radiation and perfluourohydrocarbons for 157 nm projection radiation.

However, submersing the substrate or substrate and substrate table in a bath of liquid (see for example U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

Figure 2:
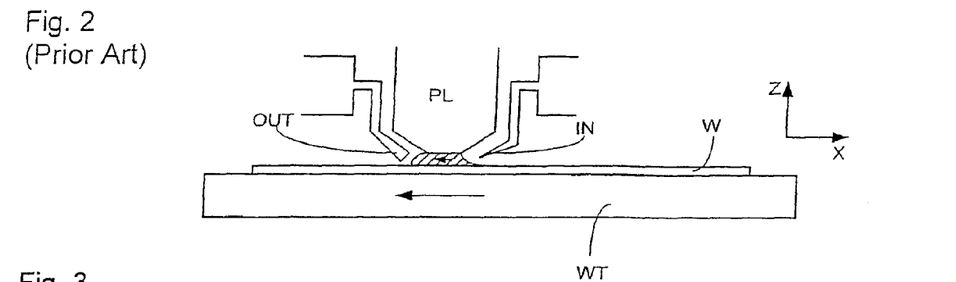
FIGS. 2 and 3 depict a liquid supply system for use in a lithographic projection apparatus.
Figure 3:
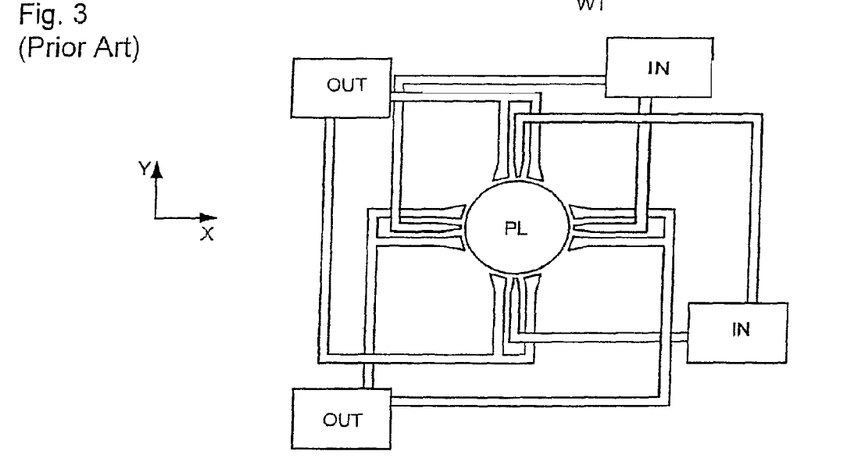

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

SUMMARY

Accordingly, it would be advantageous, for example, to provide a lithographic projection apparatus in which degradation of components, because of contact with immersion liquid, is reduced.

According to an aspect of the invention, there is provided a lithographic projection apparatus, comprising:

a projection system configured to project a patterned beam of radiation onto a substrate, the projection system comprising a final element having, on a surface nearest the substrate, a layer bonded to the surface and comprising an edge barrier, of the same material as the layer, extending from the layer away from the substrate to shield the final element from a liquid; and a liquid supply system configured to at least partly fill a space between a final element of the projection system and the substrate with a liquid.

According to an aspect of the invention, there is provided a lithographic projection apparatus, comprising:

a projection system configured to project a patterned beam of radiation onto a substrate, the projection system comprising a final element having a layer on a surface nearest the substrate, the final element being attached to the apparatus through the layer; and a liquid supply system configured to at least partly fill a space between the final element of the projection system and the substrate with a liquid.

According to an aspect of the invention, there is provided a device manufacturing method, comprising:

projecting a patterned beam of radiation onto a substrate through a liquid provided in a space between a final element of a projection system and the substrate, wherein the final element has on a surface nearest the substrate a layer through which the final element is supported.

According to an aspect of the invention, there is provided a device manufacturing method, comprising:

projecting a patterned beam of radiation onto a substrate through a liquid provided in a space between a final element of a projection system and the substrate, wherein a surface of the final element nearest the substrate has a layer bonded to it and an edge barrier of the same material as the layer extends from the layer away from the substrate to shield the final element from the liquid.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
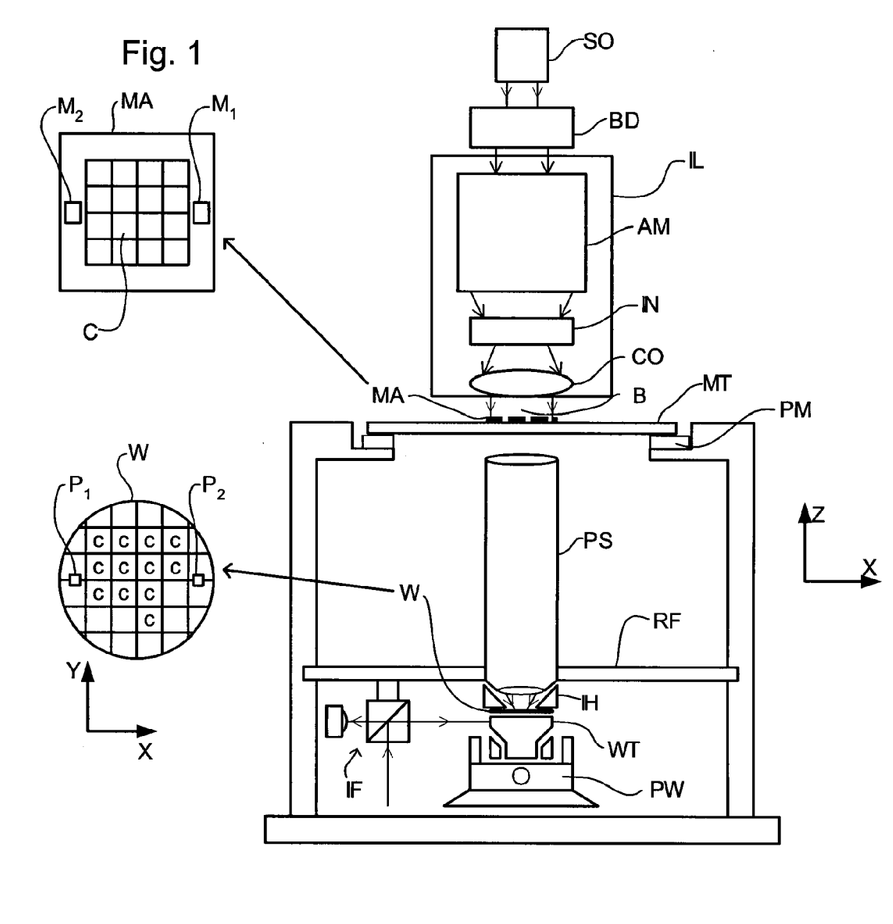
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation).

a support structure (e.g. a mask table) MT constructed to support a patterning device (e g a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 4:
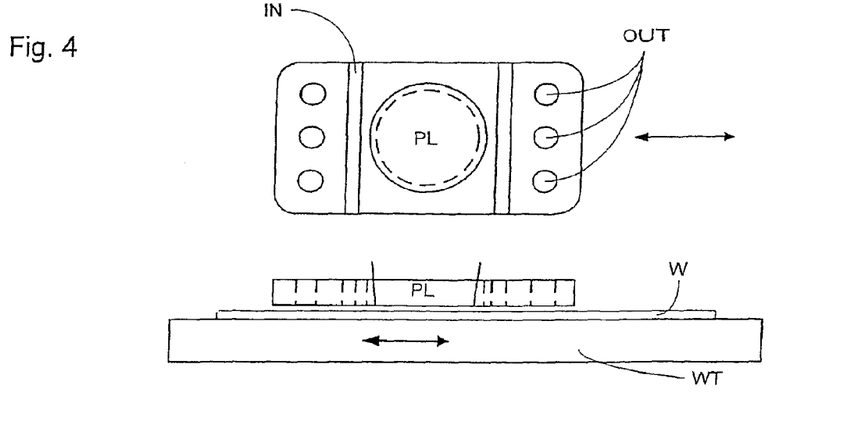
FIG. 4 depicts another liquid supply system for use in a lithographic projection apparatus.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets N and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Another immersion lithography solution with a localized liquid supply system solution which has been proposed is to provide the liquid supply system with a liquid confinement structure which extends along at least a part of a boundary of the space between the final element of the projection system and the substrate table. The liquid confinement structure is substantially stationary relative to the projection system in the XY plane though there may be some relative movement in the Z direction (in the direction of the optical axis). A seal is formed between the liquid confinement structure and the surface of the substrate. In an embodiment, the seal is a contactless seal such as a gas seal. Such a system with a gas seal is disclosed in U.S. patent application Ser. No. 10/705,783, hereby incorporated in its entirety by reference.

Figure 5:
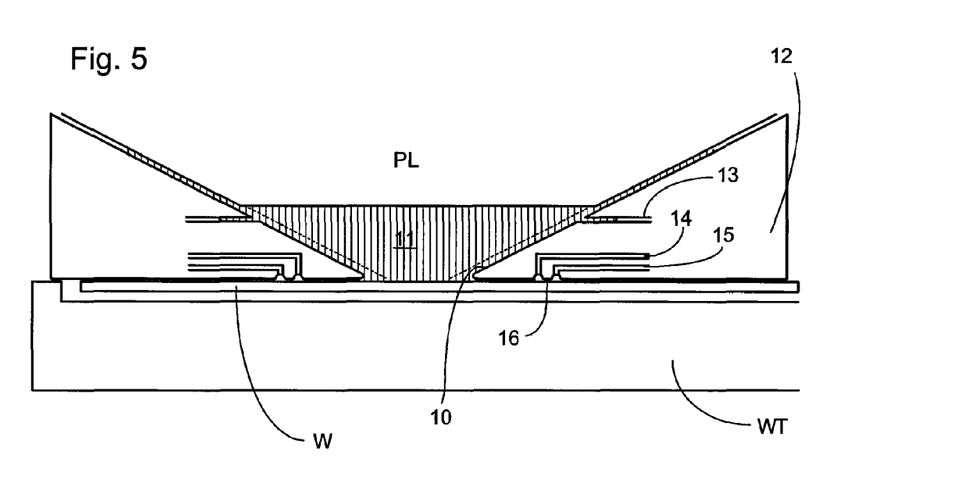
FIG. 5 depicts a liquid supply system according to an embodiment of the invention.

FIG. 5 shows a liquid supply system comprising a liquid confinement structure (sometimes referred to as an immersion hood or showerhead) according to an embodiment of the invention. In particular, FIG. 5 depicts an arrangement of a reservoir 10, which forms a contactless seal to the substrate around the image field of the projection system so that liquid is confined to fill a space between the substrate's primary surface, which faces the projection system PL, and the final element (e.g. an 'abschlussplatte' which seals the projection system, or the final optical element of the projection system) of the projection system PL. A liquid confinement structure 12 positioned below and surrounding the final element of the projection system PL forms the reservoir. Thus, the liquid supply system provides liquid on only a localized area of the substrate. The liquid confinement structure 12 forms part of the liquid supply system configured to fill a space between the final element of the projection system and the substrate W (or substrate table WT) with a liquid. Liquid is brought into the space below the projection system and within the liquid confinement structure 12. The liquid confinement structure 12 extends a little above the final element of the projection system and the liquid level rises above the final element so that a buffer of liquid is provided. The liquid confinement structure 12 has an inner periphery that at the upper end preferably closely conforms to the shape of the projection system or the final element thereof and may, e.g., be round. At the bottom, the inner periphery closely conforms to the shape of the image field, e.g., rectangular though this need not be the case. The patterned beam passes through this aperture.

The liquid is confined in the reservoir by a gas seal 16 between the bottom of the liquid confinement structure 12 and the surface of the substrate W. The gas seal is formed by gas, e.g. air, synthetic air, $N_2$ or an inert gas, provided under pressure via inlet 15 to the gap between liquid confinement structure 12 and substrate and extracted via outlet 14. The overpressure on the gas inlet 15, vacuum level on the outlet 14 and geometry of the gap are arranged so that there is a high-velocity gas flow inwards that confines the liquid. It will be understood by the person skilled in the art that other types of seal could be used to contain the liquid such as simply an outlet to remove liquid and/or gas. As with any seal, some liquid is likely to escape, for example up the outlet 14.

FIGS. 2, 3 and 4 also depict a liquid reservoir defined by inlet(s) IN, outlet(s) OUT, the substrate W and the final element of projection lens PL. Like the liquid supply system of FIG. 5, the liquid supply systems illustrated in FIGS. 2, 3 and 4, comprising inlet(s) IN and outlet(s) OUT, supply liquid to a space between the final element of the projection system and a localized area of the primary surface of the substrate.

Both of the liquid supply systems of FIGS. 2, 3 and 4 as well as other solutions, such as a bath in which the substrate W or whole substrate table WT is submerged, may be used an one or more embodiments of the invention described below.

Figure 6:
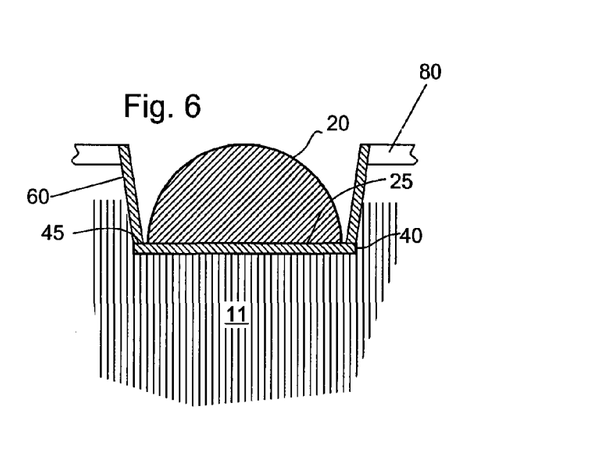
FIG. 6 depicts a layer and edge barrier applied to a final element of a projection system according to an embodiment of the invention.

FIG. 6 illustrates in detail the final element 20 of the projection system PL according to an embodiment of the invention. In the embodiment illustrated in FIG. 6, a final optical element 20 of the projection system is present which is the last lens element of the projection system PL which shapes and/or directs the patterned beam.

In an embodiment, a material transmissive of radiation at 193 nm is quartz, unless the intensity of the radiation will result in significant compaction effects. The intensity of the radiation of the patterned beam is highest at the final element, which also tends to be the smallest, so that this element is likely to suffer from compaction if made from quartz. Accordingly, in an embodiment, the material for the last element may instead be $CaF_2$ since it does not suffer from compaction at 193 nm. The use of $CaF_2$ is even more applicable for 157 nm radiation as quartz is not transmissive of radiation having this wavelength. However, $CaF_2$ may dissolve or react with immersion liquid 11 used in an immersion lithographic apparatus.

Several ways of protecting the final element 20 of the projection system are disclosed in European Patent Application No. 03257400.6, hereby incorporated in its entirety by reference.

Another concern with using $CaF_2$ for the final element of the projection system PL is that $CaF_2$ has a very high thermal expansion coefficient (40 times larger than that of fused silica) and may therefore be difficult to mount in the projection system without inducing large thermal stresses and deformations if the mounting materials are different. In the first order, these stresses and deformations change linearly with the difference in expansion coefficients. Thus, mounting a $CaF_2$ optical element may be problematic, particularly for immersion lithographic apparatus, where the positional requirement of the final lens element can be a factor of 2 to 10 times greater than that for non-immersion lithographic apparatus.

Referring to FIG. 6, a final element of the projection system according to an embodiment of the invention is depicted. The bottom surface 25 of the final element (e.g., a lens) 20 of the projection system nearest to the substrate is protected by a fused silica layer 40 which is provided on the final element 20. This layer may have a thickness in the range of 50 µm to 5 mm and may be contact bonded or glue bonded to the final element 20. In contact bonding, no glue is used—the bonding surfaces are smooth and clean enough to directly bond together. After bonding to the final element, the fused silica layer 40 may be ground and polished to the desired thickness, avoiding difficulties inherent in handling a very thin layer of fused silica. Thus, in an embodiment, the layer 40 and final element 20 are bonded together and the final element 20 is not merely coated.

Although this form of bonding can provide an exceptionally strong bond where dissimilar materials, such as $CaF_2$ and fused silica, are bonded, temperature changes and thermal gradients may cause the bond to "breathe"—differential thermal expansion or contraction of the two materials causing them to separate until the stress is relieved. Although the bond usually reforms very quickly in the case of thermal separation, if this occurs when the final element is in contact with a liquid, e.g. during polishing or grinding of the layer 40 or during use of the immersion lithographic apparatus, liquid may be drawn into the gap.

In order to protect the bond between the final element 20 and the layer 40, an edge barrier 60 of the same material as the layer 40 and extending from the layer 40 away from the substrate (towards the remainder of the projection system PL) completes the barrier around the final element 20 such that the final element 20 is shielded from the liquid 11.

The edge barrier 60 is attached around the edge 45 of the layer 40. As illustrated, the edge barrier 60 is attached adjacent an edge 45 of the plate 40 which extends beyond the edge of the bottom surface 25 of the final element 20. Other arrangements are possible, for example by bonding the edge barrier 60 to the edge surface of the layer 40 rather than to the top surface of the plate 40. In an embodiment, the bond between the edge barrier 60 and the layer 40 is a fusion bond. PCT Patent Application No. PCT/EP04/013310, hereby incorporated in its entirety by reference, describes such bonding techniques in detail. In an embodiment, the edge barrier 60 is in the form of a truncated cone. However, the edge barrier 60 may have any shape so long as it creates a cavity which can accommodate the final element 20.

The final element 20 may well have sides that overlap the bottom surface of the final element 20 such that, in an embodiment, the layer 40 overhangs the bottom surface of the final element 20 so that the edge barrier 60 can be attached to the top of the surface of the layer 40. In an embodiment, a gap is left between the edge barrier 60 and the final element 20 though this need not be the case.

As is shown in FIG. 6, the final element 20 may be mounted to mounts 80 of the projection system PS body through the edge barrier 60 and through the layer 40. This is advantageous because temperature and mounting induced stresses and deformations may be reduced significantly because the edge barrier 60 acts as a decoupling between the mounts 80 and the final element 20. Alternatively, the final element 20 may be mounted to the mounts 80 directly through the layer 40. Measurement systems or sensors configured to measure the position of the final element 20 may also be attached to the layer 40 or edge barrier 60. The attachment to the projection system or of the sensors is achievable by conventional means.

Although an embodiment of the invention has been described with the layer 40 and the edge barrier 60 comprising fused silica, any appropriate material may be used for the layer 40 and/or the edge barrier 60. In an embodiment, the material used for the layer 40 and/or the edge barrier 60 is resistant to attack by the immersion liquid, which may be a liquid other than water, and has a coefficient of thermal expansion lower than that of the material of the final element 20, which may be a material other than $CaF_2$. In an embodiment, the coefficient of thermal expansion is at least 2 times, 5 times, 10 times or 20 times lower than that of the material of the final element. The final element 20 may be made of any appropriate material.

In an embodiment, there is provided a lithographic projection apparatus, comprising: a projection system configured to project a patterned beam of radiation onto a substrate, the projection system comprising a final element having, on a surface nearest the substrate, a layer bonded to the surface and comprising an edge barrier, of the same material as the layer, extending from the layer away from the substrate to shield the final element from a liquid; and a liquid supply system configured to at least partly fill a space between a final element of the projection system and the substrate with a liquid.

In an embodiment, the edge barrier is fusion bonded to the layer. In an embodiment, the edge barrier does not contact the final element. In an embodiment, the final element is mounted to the apparatus by connection through the edge barrier and/or layer. In an embodiment, the layer is a plate. In an embodiment, the layer and edge barrier comprise fused silica. In an embodiment, the final element comprises $CaF_2$. In an embodiment, the edge barrier is in the shape of a truncated cone. In an embodiment, the layer is contact bonded to the surface. In an embodiment, the layer is substantially insoluble in the liquid. In an embodiment, the layer has a coefficient of thermal expansion lower than the coefficient of thermal expansion of the final element.

In an embodiment, there is provided a lithographic projection apparatus, comprising: a projection system configured to project a patterned beam of radiation onto a substrate, the projection system comprising a final element having a layer on a surface nearest the substrate, the final element being attached to the apparatus through the layer; and a liquid supply system configured to at least partly fill a space between the final element of the projection system and the substrate with a liquid.

In an embodiment, the apparatus further comprises an edge barrier, of the same material as the layer, extending from the layer away from the substrate to shield the final element from the liquid. In an embodiment, the layer is a plate and the final element is attached to the apparatus through the layer and through the edge barrier. In an embodiment, the layer is contact bonded to the final element. In an embodiment, the layer has a coefficient of thermal expansion lower than the coefficient of thermal expansion of the final element. In an embodiment, the layer has a coefficient of thermal expansion 10 times lower than the coefficient of thermal expansion of the final element. In an embodiment, the layer is substantially insoluble in the liquid.

In an embodiment, there is provided a device manufacturing method, comprising: projecting a patterned beam of radiation onto a substrate through a liquid provided in a space between a final element of a projection system and the substrate, wherein a surface of the final element nearest the substrate has a layer bonded to it and an edge barrier of the same material as the layer extends from the layer away from the substrate to shield the final element from the liquid.

In an embodiment, the layer is substantially insoluble in the liquid. In an embodiment, the layer has a coefficient of thermal expansion lower than the coefficient of thermal expansion of the final element.

In an embodiment, there is provided a device manufacturing method, comprising: projecting a patterned beam of radiation onto a substrate through a liquid provided in a space between a final element of a projection system and the substrate, wherein the final element has on a surface nearest the substrate a layer through which the final element is supported.

In an embodiment, the layer is substantially insoluble in the liquid. In an embodiment, the layer has a coefficient of thermal expansion lower than the coefficient of thermal expansion of the final element.

In European Patent Application No. 03257072.3, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, such as those types mentioned above, and whether the immersion liquid is provided in the form of a bath or only on a localized surface area of the substrate. A liquid supply system is any mechanism that provides a liquid to a space between the projection system and the substrate and/or substrate table. It may comprise any combination of one or more structures, one or more liquid inlets, one or more gas inlets, one or more gas outlets, and/or one or more liquid outlets, the combination providing and confining the liquid to the space. In an embodiment, a surface of the space may be limited to a portion of the substrate and/or substrate table, a surface of the space may completely cover a surface of the substrate and/or substrate table, or the space may envelop the substrate and/or substrate table.

The descriptions above are intended to be illustrative, not limiting. Thus, it will be apparent to one skilled in the art that modifications may be made to the invention as described without departing from the scope of the claims set out below.

The invention claimed is:
1. A lithographic projection apparatus, comprising:
a projection system configured to project a patterned beam of radiation onto a substrate, the projection system comprising a final element having, on a surface nearest the substrate, a layer overlying the surface of the final ele- ment, and comprising an edge barrier, not directly in contact with the final element, shielding the final element from the liquid; and a liquid supply system configured to at least partly fill a space between the final element of the projection system and the substrate with a liquid.

2. The apparatus of claim 1, wherein the edge barrier is connected to the layer.

3. The apparatus of claim 1, wherein the final element is mounted to the apparatus by connection through the edge barrier and/or layer.

4. The apparatus of claim 1, wherein the layer is a plate.

5. The apparatus of claim 1, wherein the layer and edge barrier comprise fused silica.

6. The apparatus of claim 1, wherein the final element comprises $CaF_2$.

7. The apparatus of claim 1, wherein the edge barrier is in the shape of a truncated cone.

8. The apparatus of claim 1, wherein the layer is contact bonded to the surface.

9. The apparatus of claim 1, wherein the layer is substantially insoluble in the liquid.

10. The apparatus of claim 1, wherein the layer has a coefficient of thermal expansion lower than the coefficient of thermal expansion of the final element.

11. A lithographic projection apparatus, comprising:

a projection system configured to project a patterned beam of radiation onto a substrate, the projection system comprising a final element having a layer contacting a surface of the final element nearest the substrate and comprising an edge barrier, connected to the layer and spaced apart from a side surface of the final element at least at a point where the edge barrier and the layer connect, shielding the final element from the liquid; and a liquid supply system configured to at least partly fill a space between the final element of the projection system and the substrate with a liquid.

12. The apparatus of claim 11, wherein the edge barrier diagonally extends from the layer away from the substrate to shield the final element from the liquid.

13. The apparatus of claim 12, wherein the layer is a plate and the final element is attached to the apparatus through the layer and through the edge barrier.

14. The apparatus of claim 11, wherein the layer is contact bonded to the final element.

15. The apparatus of claim 11, wherein the layer has a coefficient of thermal expansion lower than the coefficient of thermal expansion of the final element.

16. The apparatus of claim 15, wherein the layer has a coefficient of thermal expansion 10 times lower than the coefficient of thermal expansion of the final element.

17. The apparatus of claim 11, wherein the layer is substantially insoluble in the liquid.

18. A device manufacturing method, comprising:

projecting a patterned beam of radiation onto a substrate through a liquid provided in a space between a final element of a projection system and the substrate, wherein the final element has on a surface nearest the substrate a layer overlying the surface of the final element; and shielding the final element from the liquid using an edge barrier that is not directly in contact with the final element.

19. The method of claim 18, wherein the layer is substantially insoluble in the liquid.

20. The apparatus of claim 1, wherein the edge barrier diagonally extends from the layer away from the substrate to shield the final element from the liquid.

* * * * *